United States Patent [19]
Englert

[11] Patent Number: 5,560,100
[45] Date of Patent: Oct. 1, 1996

[54] SYSTEMS AND METHOD FOR AUTOMATIC DISASSEMBLY

[76] Inventor: Klaus Englert, Frohsinnstrasse 14, D-63755, Alzenau, Germany

[21] Appl. No.: 411,798

[22] PCT Filed: Nov. 20, 1993

[86] PCT No.: PCT/DE93/01104

§ 371 Date: Apr. 3, 1995

§ 102(e) Date: Apr. 3, 1995

[87] PCT Pub. No.: WO94/13124

PCT Pub. Date: Jun. 9, 1994

[30] Foreign Application Priority Data

Nov. 26, 1992 [DE] Germany ............... 42 39 642.5
Sep. 22, 1993 [DE] Germany ............... 43 32 236.0

[51] Int. Cl.⁶ ..................................................... H05K 3/30
[52] U.S. Cl. ................. 29/833; 29/712; 29/720; 29/740; 29/741
[58] Field of Search ............. 29/825, 833, 720, 29/407, 712, 740, 741

[56] References Cited

U.S. PATENT DOCUMENTS

| | | | |
|---|---|---|---|
| 4,222,036 | 9/1980 | Troukens ........................... | 29/833 |
| 4,742,947 | 5/1988 | Coffman et al. ................... | 29/833 X |
| 5,044,072 | 9/1991 | Blais et al. ........................ | 29/833 X |
| 5,172,468 | 12/1992 | Tanaka et al. ..................... | 29/833 X |
| 5,194,948 | 3/1993 | L'Esperance III et al. ........ | 29/833 X |
| 5,311,304 | 5/1994 | Mowno ............................... | 29/833 X |
| 5,384,956 | 1/1995 | Sakurai et al. ..................... | 29/833 X |
| 5,456,003 | 10/1995 | Yamamoto et al. ................ | 29/833 |

FOREIGN PATENT DOCUMENTS

| | | | |
|---|---|---|---|
| 355377 | 2/1990 | European Pat. Off. . | |
| 3935424 | 4/1990 | Germany . | |
| 4-107994 | 4/1992 | Japan ................................. | 29/720 |
| 4-340799 | 11/1992 | Japan ................................. | 29/712 |
| 5-136600 | 6/1993 | Japan ................................. | 29/712 |
| 6-53694 | 2/1994 | Japan . | |

*Primary Examiner*—Carl J. Arbes
*Attorney, Agent, or Firm*—Edwin D. Schindler

[57] ABSTRACT

An apparatus for automatically removing electronic components mounted on printed circuit boards has a lighting device for illuminating the printed circuit boards, an optical sensor, an image processing systems and various devices for removing the electronic components therefrom. The image processing system recognizes the coordinates of the contours and, preferably, also the types of components from the output signals supplied by the optical sensor and controls the device for removing the electronic components. Alternatively, the contours of the electronic components are recognized by infrared radiation. Additionally, a process is disclosed for removing the electronic components from printed circuit boards using the disclosed apparatus.

34 Claims, 7 Drawing Sheets

5,560,100

SYSTEMS AND METHOD FOR AUTOMATIC DISASSEMBLY

BACKGROUND OF THE INVENTION

1. Technical Field of the Invention

The invention concerns two systems for the automatic disassembly of printed circuit boards with mounted electronic components and a method under use of such a system.

2. Description of the Prior Art

Current methods of disposing of printed circuit board assemblies deriving from faulty or outdated devices consist of dumping at landfill sites and incineration. The high content of hazardous and valuable materials means that such boards are particularly interesting as concerns dismantling. It is therefore suitable to separate the components mounted on the printed circuit boards into reusable, recoverable components and those designated as special waste. Manual disassembly of the boards is not economical in view of the high labour costs, while a system that automatically disassembles the components is previously unknown.

For example in the journal "Surface Mount Technology", edition 8 (1992), page 63, in the centre and right-hand columns, it is stated that electronic scrap is not reusable but must be treated materially, i.e. thermally or chemically.

SUMMARY OF THE INVENTION

DE 39 35 424 A1 discloses a line scanning device for recording articulated patterns. To this end, a laser beam is deflected via a plurality of mirrors and lens on to a plane, so that it impinges vertically upon this plane. The reflected laser beam is evaluated by a beam point position detector. This device can especially be used to check circuit boards whereby patterns recorded by the beam point position detector are compared with target values. Such a device cannot automatically execute a board disassembly, as its does not possess tools for disassembly. Furthermore, it does not have the capability to classify the components and therefore to differentiate between reusable, recoverable components and those designated as special waste. The additional disadvantage of this device is that it requires a costly mirror and lens arrangement.

On this basis the invention is based on the problem of disassembling printed circuit boards with mounted electronic components and salvaging the still usable components.

In the following two alternative possible solutions are proposed one of which functions with light and one with infrared radiation.

According to this invention, this object is solved through a lighting device for illuminating the printed circuit boards, an optical sensor, an image processing system and a device for removing the components, whereby the image processing system is designed in such a way that, from the output signal delivered by the optical sensor, it recognises the co-ordinates of the contours and preferably the types of components and controls the device for removing the components.

The central idea of the invention is the design of a system which in a first process step illuminates a printed circuit board with mounted electronic components and records it with an optical sensor. The illumination is advantageously rich in contrast to simplify image processing and to avoid errors. The output signal of the sensor is fed to an image processing system which recognises the co-ordinates of the contours and preferably also the types of components and controls the next process step, in which with the aid of a device the components are removed from the board.

The reusable components can be used again, while the components specified for special disposal can be incinerated separately or disposed of, whereby a large reduction of incurred special waste is achieved. The printed circuit boards are also reusable after the components have all been removed, a pre-condition for recycling, and they have been shredded.

DETAILED DESCRIPTION OF PREFERRED EMBODIMENTS

Figure 1:
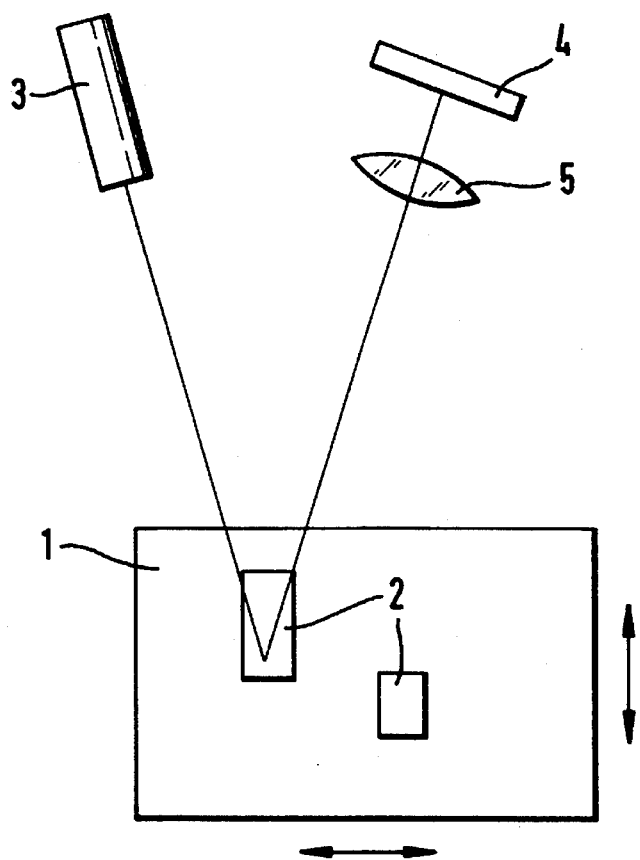

To improve error protection through a clear recognition of contours of the components even in the case of low brightness contrasts, it is especially proposed that the lighting device generates a punctual light beam that is approximately orthogonal to the plane of the printed circuit board, that a lens is disposed in such a way that it projects the light beam reflected from the printed circuit board on to the optical sensor which is affixed preferably at a short distance adjacent to the lighting device and is a line sensor, that the lighting device generates a punctual light beam on the printed circuit board that is approximately orthogonal to the plain of the printed circuit board, that a lens is disposed is such a way that it projects the light beam reflected from the printed circuit board on to the optical sensor which is affixed preferably at a short distance adjacent to the lighting device and is a line sensor, the axis of the sensor is arranged approximately orthogonally to the reflected light beam and the in plane formed by the specular angle and the printed circuit board is shifted parallel to the surface relatively to the optical sensor and the lighting device in such a way and/or that the light beam is deflected in such a way that the printed circuit board is scanned two-dimensionally.

The basic idea of this embodiment includes therein that the surface of the printed circuit board is scanned two-dimensionally and the height of any components is defined according to the principle of point-by-point triangulation. The lighting device provides a punctually impinging light beam approximately orthogonally to the printed circuit board, which is reflected according to the reflection law primarily at a specular angle (i.e. the angle of incidence and reflection is identical). The incident light is therefore usually not oriented exactly orthogonal to the surface of the printed circuit board. The reflected light beam is projected on to the optical line sensor by a lens, the axis (that is the direction of resolution) of the sensor being approximately orthogonal to the reflected light beam and arranged in the plane formed by the specular angle. The direction of the reflected light beam depends on the distance between the lighting device and the surface, because in the case of a greater distance it also travels a further path parallel to the surface. The position of the element of the line sensor that is illuminated with the greatest intensity is a direct measure of the distance between the reflecting surface and the lighting device or the sensor and is used by the image processing system for information on the height of any components. For reasons of compactness the sensor is preferably disposed at a short distance adjacent to the lighting device; a further advantage of the angle of incidence and reflection, which is approximately orthogonal to the surface of the printed circuit board, includes therein that undesired measurement errors, which result from the interruption of the beam path on edges of components, are decisively reduced. The printed circuit board is scanned through surface-parallel displacement relative to the optical sensor and the lighting device and/or by means of deflection of the light beam, which is realisable, for example, through a moved mirror, so that the image processing system is provided as a result with a three-dimensional image of the printed circuit board. The advantages comprise primarily therein that, owing to the three-dimensional record, the contours of the components are recognised exactly, so that no operating errors occur with the device for removing the components caused by the image processing system.

Furthermore, the error probability can also be reduced in that on the printed circuit board the lighting device generates a linear light beam which is approximately orthogonal to the plane of the printed circuit board, that a lens is affixed in such a way that it projects the line reflected from the printed circuit board on to the optical sensor, which is a surface-area sensor, which is preferably arranged adjacent to the lighting device, and that the printed circuit board is shifted and scanned parallel to the surface, orthogonally to the line of the light beam relative to the optical sensor and the lighting device.

The central idea of this improvement including replacing the punctual light beam by a linear light beam in order to simultaneously record the height profile of the one-dimensionally illuminated printed circuit board surface by means of a surface-area sensor. The linear light beam generated by the lighting device, impinging as far as possible vertically on the printed circuit board, is reflected and projected through a lens on to the optical surface-area sensor, which is usually arranged at a specular angle. The image processing system recognises the height of a measurement point using the position of greatest intensity in the direction orthogonal to the line. Because the surface-area sensor records all the points illuminated by the linear light beam simultaneously, the printed circuit board is only scanned in one direction, parallel to the surface, orthogonally to the line, i.e. shifted relative to the optical sensor and to the lighting device. It must be noted that also in this alternative, for reasons of design, the optical sensor is preferably affixed adjacent to the lighting device. In addition to the low incidence of errors and three-dimensional record of the surface of the printed circuit board, the advantages are primarily in the decisively shortened period of time required to record a printed circuit board and thus improved economic efficiency.

Especially, the recognition dependability of the image processing system can be increased in that the lighting device generates a plurality of light beams, parallel to one another, approximately orthogonal to the plane of the printed circuit board and stripe-like on the printed circuit board, and that a lens is disposed is such a way that it projects the beams reflected from the printed circuit board on to the optical sensor, which is a surface-area sensor and is preferably arranged at a short distance adjacent to the lighting device.

The idea includes projecting a plurality of parallel measurement lines simultaneously onto the surface of the printed circuit board and similarly to evaluate them simultaneously with a surface-area sensor. The stripe-like beams created by the lighting device also impinge the surface of the printed circuit board at an approximately perpendicular angle, are reflected and projected through a lens on to the surface-area sensor, which is normally disposed at a specular angle. The distance between the lighting device and the reflecting surface is represented by the position of the brightest illuminated point of the surface-area sensor in the orthogonal direction to the beams. However, the surface-area sensor records not only one, but a plurality of lines simultaneously, so that a scanning of the printed circuit board is not required.

The angle of incidence and reflection of the light beams on the printed circuit board are advantageously (depending on the height of the components to be disassembled) selected so that displacement in the direction perpendicular to the beams is less than their distance apart, thus ruling out interference. The surface-area sensor is also preferably mounted proximate to the lighting device. The advantages include primarily therein that the entire printed circuit board is recorded simultaneously by the image processing system, so that the time required therefor is further reduced and a more cost effective disassembly made possible.

Because the allocation of the individual lines to the respective points on the board proves problematic in the projection of an individually sufficiently fine striated pattern to recognise the details, in an advantageous improvement of the invention it is proposed that the lighting device generates successive lines of differing number and width. The individual profile lines are identified by the image processing system using the known, defined light and dark phases. In detail, n different striated patterns enable 2n profile lines to be distinguished.

Owing to the relatively simple allocation of lines to the individual height profiles, it is recommended that the lighting device produces double the number of successive lines and of halved width; alternatively it is naturally possible to double the width of the lines and to halve their number.

For the lighting device, there are sufficient bright, intensive, commercially lasers available and especially suitable laser diodes. The possibly required divergence of the laser beam to realise a linear light beam is easily facilitated by means of a cylinder lens or a swivelling mirror.

Especially, the lighting device can emit x-rays extending preferably orthogonally to the plane of the printed circuit board and the optical sensor can be disposed on the surface of the printed circuit board opposite to the lighting device in order to use the absorption behaviour of the components for x-radiation for their recognition. Because it is primarily metals that weaken, the x-radiation which is emitted by the lighting device, which impinges the printed circuit board orthogonally, the image recorded by the optical sensor on the surface of the printed circuit board opposite to the lighting device corresponds to the thickness of the metal penetrated by the radiation. The connection pegs of the components, which are aligned parallel to the x-radiation are easily recognisable in connection with the associated soldered connections. Other metal components, such as metal casings, dissipators, metal condensators, are also clearly recorded. In addition to the clear identification of the component connections, it is to be seen as advantageous that scanning the printed circuit board—if a surface-area sensor is used—is unnecessary, so that a printed circuit board can be recorded within the shortest time.

Alternatively, the object on which this invention is based can be solved through an optical sensor, an image processing system and a device for removing the components, whereby the image processing system is designed in such a manner that it recognises the co-ordinates of the contours and preferably the types of the components from the output signal delivered by the optical sensor and controls the device for removing the components, the printed circuit board is heated, and the optical sensor is a thermal sensor, preferably a thermal camera.

The central idea includes therein to heat the printed circuit board and to record during the warming phase the different temperatures of the components—owing to the varying thermal conductivities—and the areas of the printed circuit board without mounted components in order to identify the contours of the components using a thermal sensor, preferably a thermal camera. To achieve a satisfactory signal-to-noise ratio, the temperature of the printed circuit board exceeds that of the environment, however, is so low that there is no fear of thermal damage to the components.

Especially, the great contrast achievable between components and the printed circuit board is to be seen as an advantage, so that the device for removing the components is controllable through the image processing system with a low incidence of errors. Scanning of the printed circuit board is no longer necessary, if a two-dimensional thermal camera is used.

Especially, a solder bath can be used to heat the printed circuit board to the required temperature.

In the case of the sensors usable for recording the light or the x- or thermal, that is, infrared radiation, one can basically differentiate between one and two dimensional embodiments. Whereas surface-area sensors directly create a projection of the object to be examined, line sensors must scan the printed circuit board to be imaged, which means they are either conveyed past the sensor (e.g. on conveying belts) or an independent deflecting system is disposed in front of the sensor (scanner). From the great variety of surface-area sensors, it can be differentiated between TV-oriented cameras, which follow the German-American standard (CCIR), have a resolution exactitude of 1024×1024 pixels and are relatively low-priced and the so-called standard-free sensors which offer a higher resolution of up to 2048×2048 pixels and high image resolution frequency of up to 400 Hz. The line sensors deliver up to over 8000 pixels and data rates of up to 160 MHz. These systems are far more complicated than surface-area sensors, however, are of optimum use for recording boards conveyed at a constant speed.

The scanning of the printed circuit board can also prove appropriate in the case of surface-area sensors, because the economical embodiments available today are capable of recording larger printed circuit boards in a single process step. A further advantage of scanning includes therein that components can be recorded twice and therefore most recording errors eliminated. This method also permits angular observation of the components and simplifies the recognition of angled or laterally disposed markings.

If the optical sensor delivers not only digital, i.e. output signals distinguishing between light and dark, but grey scale values, this is a decisive facilitation for the recognition of height profiles and possibly types of components. On the one hand, the advantage includes therein that very strong or weak reflective surfaces can be examined, on the other hand, the reflectivity of the components can be used for their identification.

Furthermore, an automatic control of the intensity of the lighting device is recommended, since the contours and preferably also the markings of extremely strong or weak reflective components can be detected.

The image processing system requires a reference point on the board in order to determine relatively thereto the co-ordinates of the components and to control the device for their removal. In a suitable embodiment of the invention, the intersecting point of two locating edges, at which the board is secured with two grippers, is used as a reference point. The securing of the board prevents the board from slipping during transport or the removal of the components and thus creating a disturbance. Moreover, any boards can be disassembled since in common all satisfy the feature of two continuous and adjacent edges.

Because the components arranged on the printed circuit board, especially the semiconductors, are temperature sensitive, it is not appropriate, during the disassembly process, to always subject the entire solder side of the printed circuit board to the temperature at which the solder melts. It therefore presents itself only to liquefy the soldered connections of the components to be removed. In a suitable embodiment of the invention, the heating device is also controlled by the image processing system and liquefies the corresponding soldered connection through a solder wave or a jet with a hot liquid or infrared radiation or hot air, whereby all four mentioned heating possibilities are suitable owing to their good proportionability, localisation and the easy regulation of the temperature.

The advantage of the use of a hot liquid lies in the direct and rapid transmission of heat to the soldered connection, thereby protecting the components. Here non-combustible or not easily combustible substances such as oil or paraffin offer themselves, especially suitable is glycerine.

In the disassembly of components it is to be differentiated between wired and surface mounted devices (SMDs). Wired components are found on almost all printed circuit boards, therefore corresponding removal devices are required in all events. If SMDs are to be removed from the printed circuit board, the system must have two differently designed grippers and heating elements, since the surface-mounted components are rigidly soldered on their mounting side, which normally corresponds to the side opposite to the wired components.

It offers itself to remove the SMDs in a first operational cycle, as they often contain temperature-sensitive semiconductor components. The soldered connection is heated during a component-dependent period of time and melted open and the component removed from the solder side. Hot air, infrared radiation or a jet of hot liquid are suitable for heating, because the corresponding heating elements can be designed independently of the form of the components and facilitate the simultaneous heating of all solder points of a component. After the solder has melted, the heating device switches to the following assembly to avoid a collision with the gripper and the gripper adapted to the shape of the component removes the component from the printed circuit board. Owing to a lack of other gripping possibilities, this gripper is designed in such a way that it sucks in the surface of the component with negative pressure.

After the removal of the surface mounted devices, the soldered connections of the wired components are heated advantageously from the solder side and grasped by a self-centring gripper and drawn to the component mounting side. The self-centring property is achievable in that the grippers tools are float or spring mounted and provided with gripping cants. Through this property it is achieved that the component is grasped even in the case of a certain deviation from the target position stored in the image processing system. Some components, such as electrolytic capacitors with radial leads, can only be removed at the components themselves and not by their leads. If the leads of the components are bent on the solder side of the board, the component is removed in the usual way, since the probability of a disturbance or damaging of the component here is low, as the forces arising with this forming process are low relative to the tensional forces of the actual disassembly process and, on the other hand, the point of application of force in the case of most components does not lie at the component itself but at its lead.

To reuse the removed components or to furnish them for special disposal, the invention is designed suitably so that the removed components are placed in assigned receptacles. The image processing system is to be advantageously designed in such a way that the most common components are placed in receptacles that can be reached rapidly and those that seldom occur in receptacles that are reached more slowly. The reusable and the special waste components can, after a certain number of boards have passed through, be removed from the receptacles and supplied for their further use.

For reasons of economy, it is unjustifiable to remove all components from the printed circuit board with the removal device controlled by the image processing system, rather initially to leave non-reusable components on the board. These can be removed in a subsequent process step with a mass disassembly device. For this, it offers itself to provide a mechanical device which is designed as a milling and/or as a brushing and/or as a drilling and/or as a sucking and/or as a planing device. These mechanical devices remove in one operational cycle all remaining components from the printed circuit board. Alternatively to these mechanical devices, one can also provide a laser separating device or a chemical solvent device, also a breaking device or a local or complete unsoldering device is usable for this step.

The components disassembled by the mass disassembly device are, in a further advantageous embodiment of the invention, sorted in order to supply the individual component types separately for reuse. This separation considerably facilitates later reutilisation.

The completely disassembled boards are advantageously stacked by a suitable device and later can be comminuted and utilised.

The method proposed according to this invention is as follows:

A printed circuit board to be disassembled is advantageously initially cleaned in order to facilitate the image processing and removal system a better recognition of the components. For cleaning, the board is placed in an immersion bath and/or cleaned with ultrasound and/or with a spraying method and/or with rotating brushes. With this cleaning method, for environmental reasons, no solvents are used, furthermore attention is paid that the maximum approved temperatures of the components are not exceeded. It offers itself to use continuous cleaning methods, which, like the mentioned methods, can be directly integrated in the material flow. Thereafter the board is illuminated by a suitable lighting device and scanned with an optical sensor, the output signal of the sensor is processed by the image processing system to recognise the co-ordinates and types of components, and then the device for removing the components controlled. This first removes the economically profitable, reusable components and the components containing pollutants and places them in their assigned receptacles.

After their cleaning, with some printed circuit boards it is necessary to free them of special components, which, for the present, must still be carried out manually. The designation here of special components includes, e.g. transformers, superimposed boards and other components that cannot be automatically disassembled. Especially, the image processing system is dependent thereupon that the components are arranged two-dimensionally on the printed circuit board. In the system according to this invention, the automatic disassembly of such special components is not planned, can however be facilitated in an extension.

After the automatic removal of the reusable components, the remaining, only recoverable components are removed with a mass disassembly device and then sorted. The completely disassembled boards are stacked and processed.

The economically profitable, disassembled components are checked as regards their function, re-cleaned, their contacts straightened and freed of residual solder and re-tin-coated. They can then be stored and resold.

BRIEF DESCRIPTION OF THE DRAWING FIGURES

Figure 8:
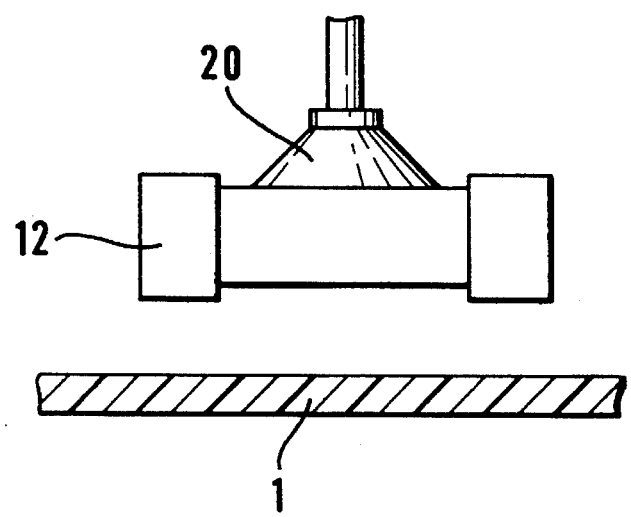
Figure 9:
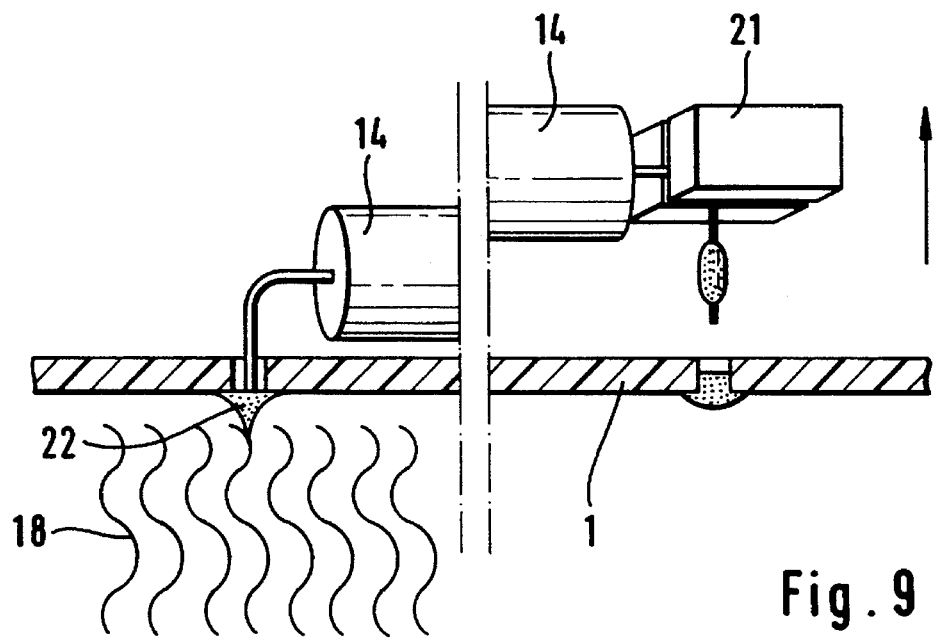
Figure 10:
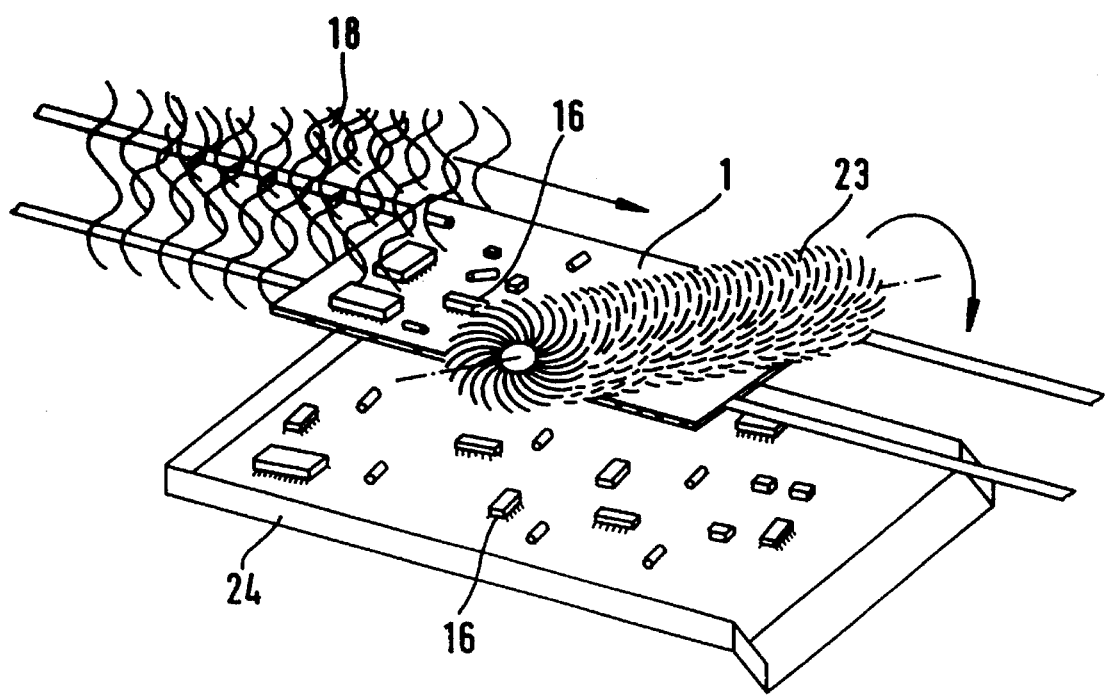

Further details, features and advantages of the invention can be taken from the following description part in which typical embodiments of the invention are explained in greater detail. They show in schematic representation in FIG. 1 a detail sketch of a system with a punctual light beam FIG. 2 a detail sketch of a system with a linear light beam FIG. 3 a detail sketch of a system with a plurality of stripe-like light beams FIG. 4 a detail sketch of a system that transilluminates the printed circuit board with x-rays FIG. 5 a detail sketch of a system that records the infrared radiation of the printed circuit board FIG. 6 a schematic diagram of the processing steps of the printed circuit board with mounted components FIG. 7 the heating of the soldered connections of surface-mounted components FIG. 8 the removal of surface-mounted components from the board FIG. 9 the removal of the wired components FIG. 10 a mass disassembly device

DETAILED DESCRIPTION OF THE DRAWING FIGURES

FIG. 1 represents the optical recording of the components (2) affixed on a printed circuit board (1). The light beam emitted by the lighting device impinges printed circuit board (1) at an almost vertical angle. At the specular angle, a projecting lens (5) which projects the light spot on printed circuit board (1) on to an optical sensor (4), as represented in the example as a line sensor (4). The axis of sensor (4) is approximately orthogonal to the reflected light beam and disposed in the plane formed by the specular angle. The printed circuit board is shifted for scanning in the two surface-parallel directions along its edges.

Figure 2:
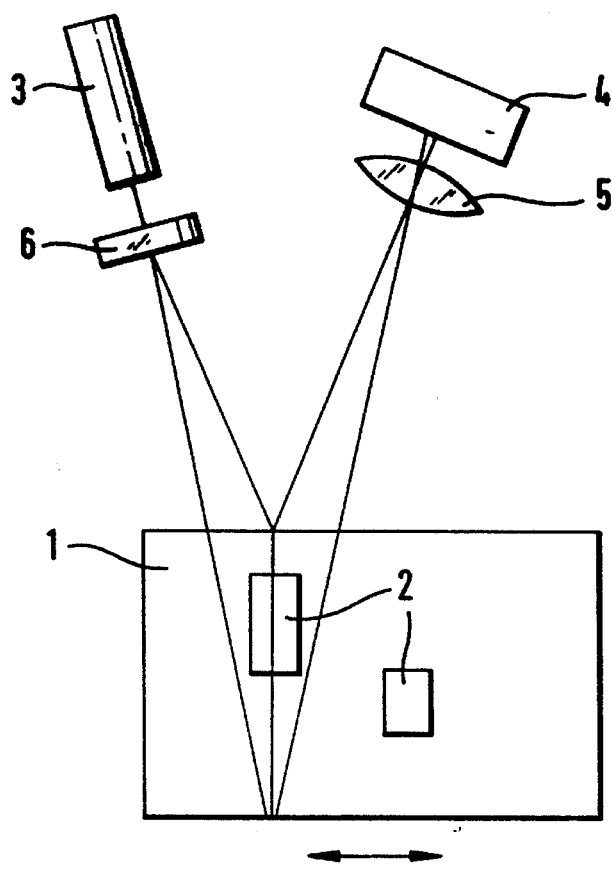

In FIG. 2 the beam emerging from the direction of illumination is expanded through a cylinder lens (6) to a line parallel to the shorter edge of printed circuit board (1). Lens (5) also disposed in the specular angle projects the reflected light beam on to optical sensor (4) which in the represented example functions two-dimensionally. For scanning, printed circuit board (1) is only shifted in the orthogonal, surface-parallel direction to the line.

Figure 3:
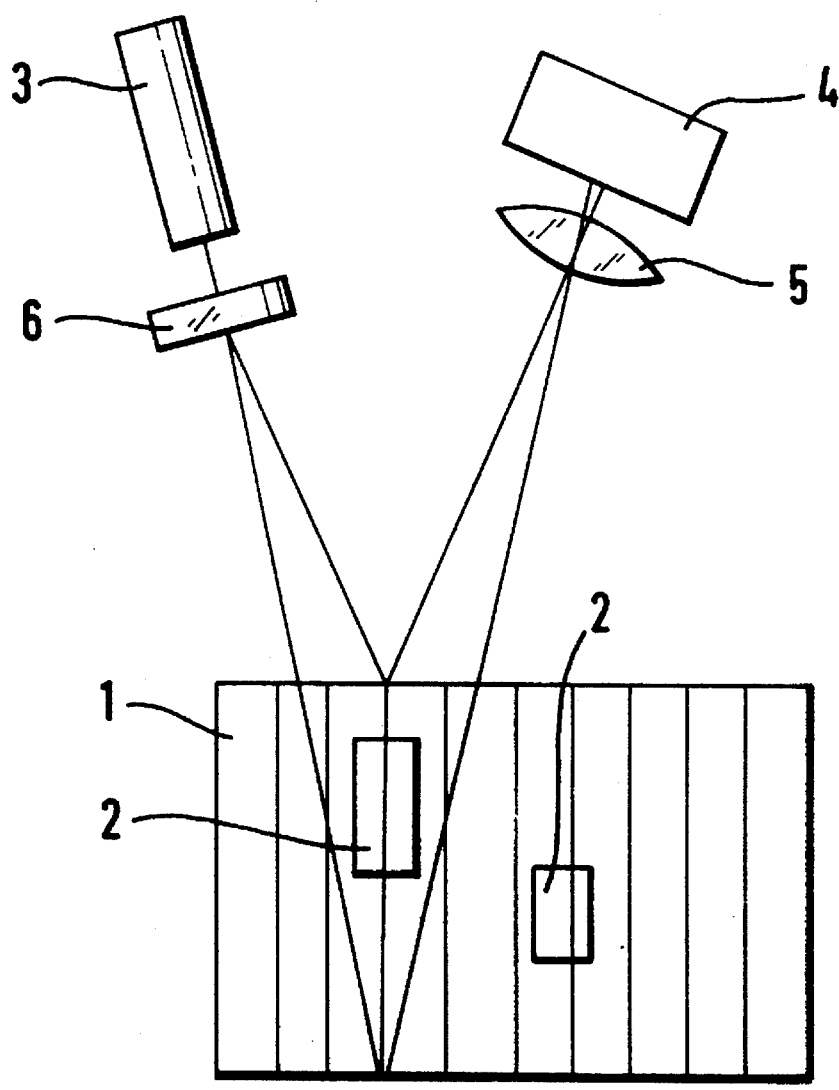

In the case of the system represented in FIG. 3, in contrast to the preceding drawing, a striated pattern is created on printed circuit board (1) through lighting device (3). However, the arrangement of sensor (4) and lens (5) is no different. Through the striated pattern, the entire printed circuit board is simultaneously read; scanning is not required. The lighting device (3) can emit successive beams in different numbers and/or width in order to facilitate identification of the reflected lines.

Figure 4:
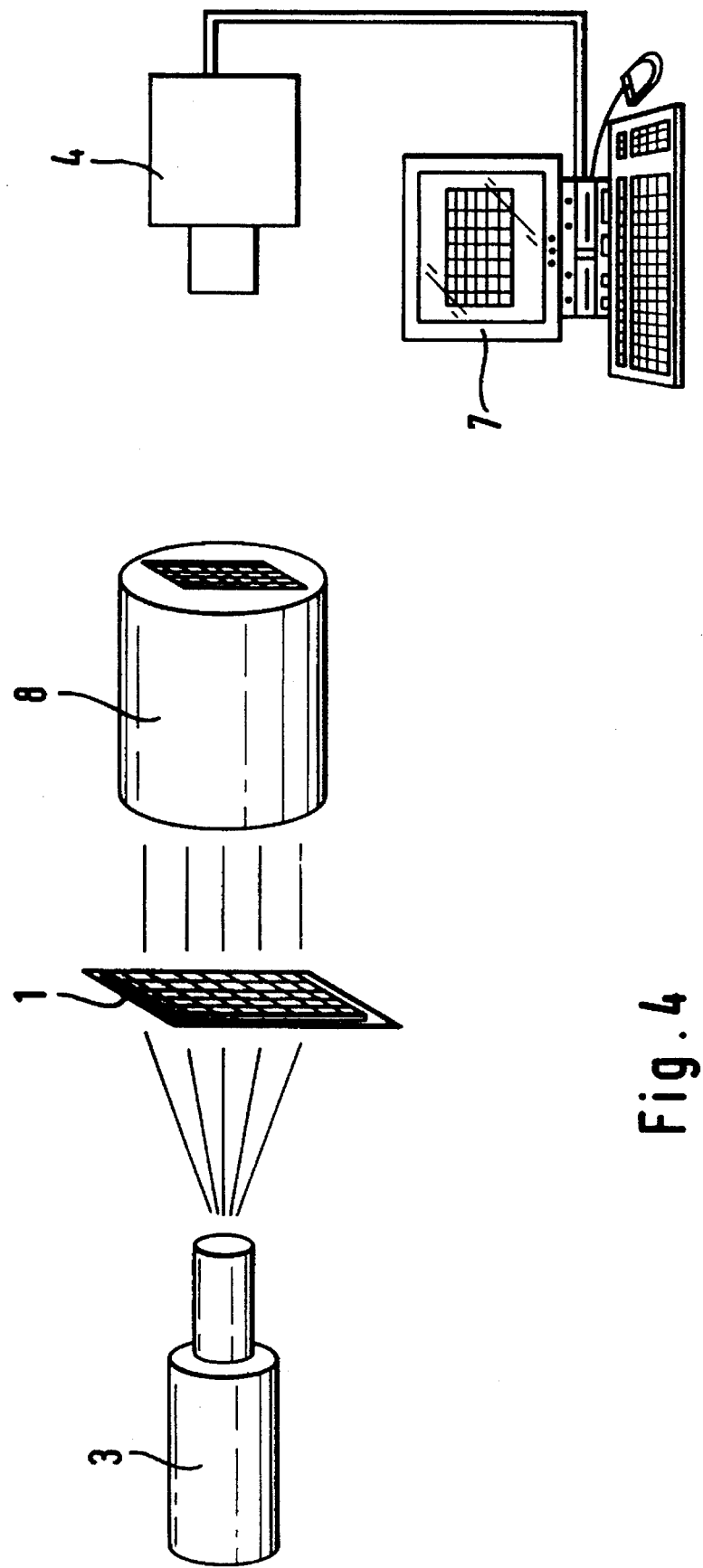

With the system represented in FIG. 4, printed circuit board (1) is transilluminated by lighting device (3) which produces x-rays. The transmitted photons are routed by a filter (8) to an optical sensor (4). The image processing system, which is implemented on a measuring computer, recognises the contours of components (2) by means of the absorbed x-radiation and controls the device, which is not represented in the drawing, for removal of components (2).

Figure 5:
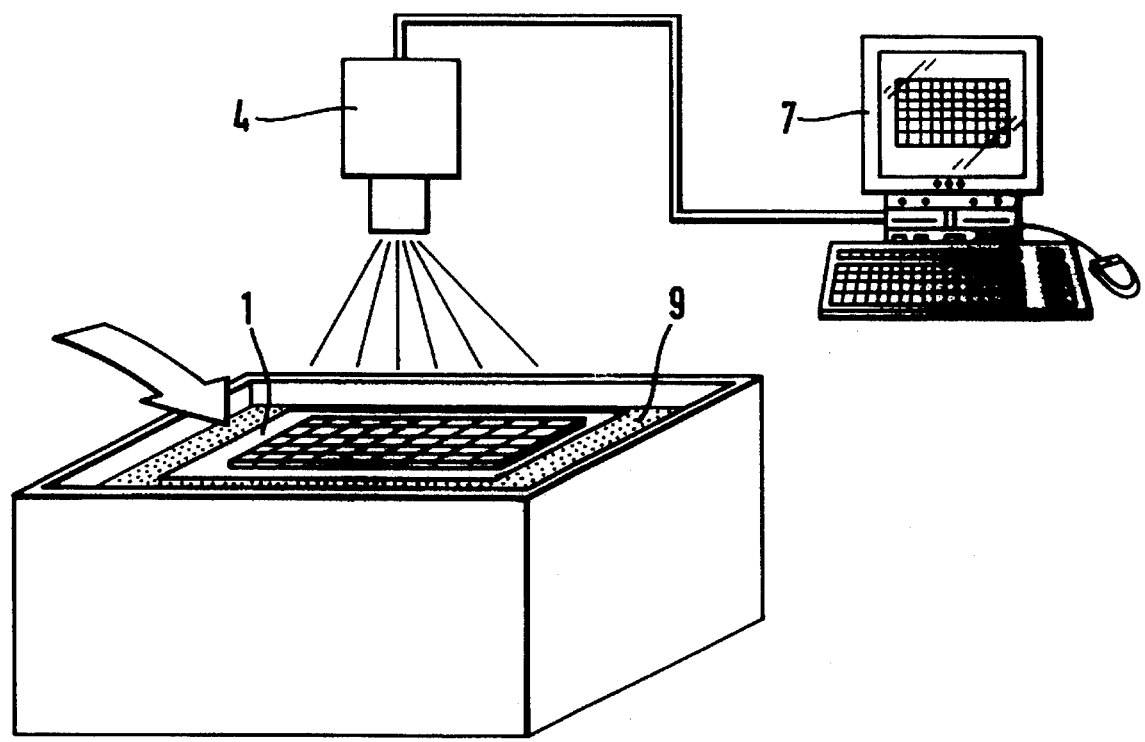

In FIG. 5, printed circuit board (1) is heated by a solder bath. The emitted infrared radiation is recorded by the optical surface-area sensor (4), i.e. a thermal camera, and supplied to measuring computer (7). The contours of components (2) are recognised by means of their low temperature which deviates from the actual printed circuit board (1) owing to the different thermal conductivity.

Figure 6:
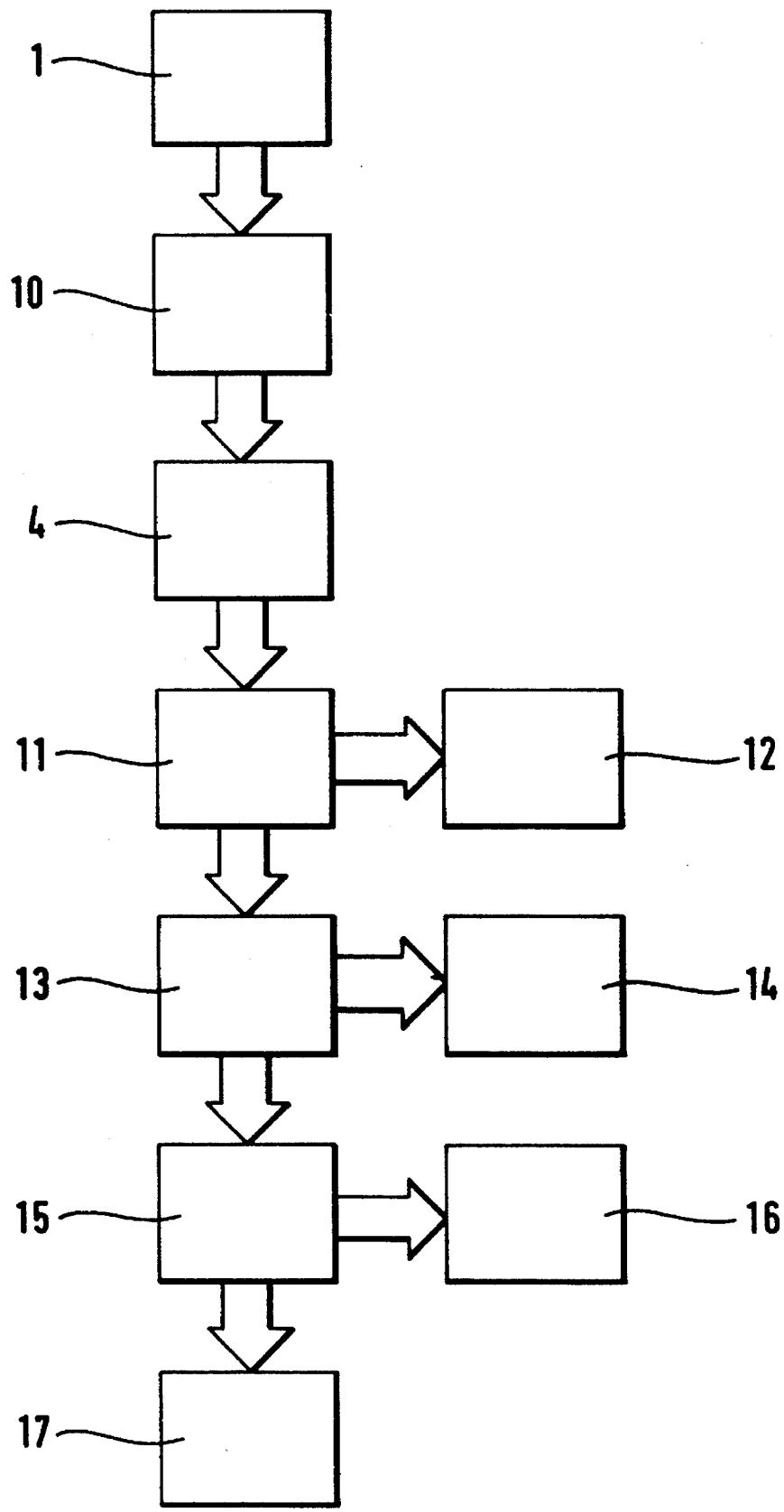

The printed circuit board disassembly represented in FIG. 6 functions according to the principle that printed circuit boards (1), with mounted electronic components (12, 14, 16), are cleaned in a first process step (10). Thereafter printed circuit boards (1) are illuminated by a suitable device of reflexfree function and scanned with an optical sensor (4). The output signal of this sensor (4) is used by the image processing system to calculate the position and types of components (12, 14) on board (1) by comparing contours, colour, shape and marking with a database. The image processing system controls the next process step in which components are removed from printed circuit board (1) by a removal device (11) for surface mounted components with a gripper (20) which functions with negative pressure. These components (12) can be reused. In the next process step components (14) provided with leads are removed by a suitable removal device (13) with a gripper (21) that mechanically grasps component (14). Removed wired components (14) can, as with the surface mounted components (12), be reused or disposed of as special waste. On printed circuit board (1) remain only utilisable components (16). These are removed in a mass disassembly device (15) from printed circuit board (1) which is then completely free of components (12, 14, 16) and can also be utilised. The fully disassembled board (17) is stacked and utilised.

Figure 7:
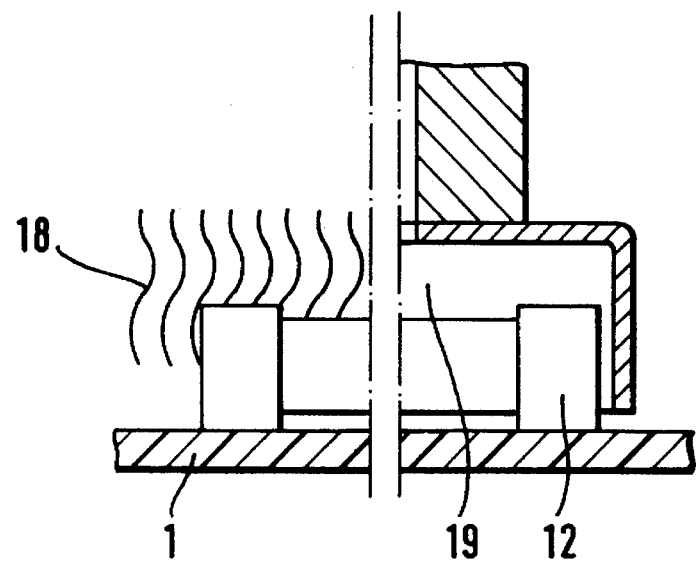

FIG. 7 represents two possibilities for liquefying the soldered connections on cleaned in a first process step (10). Thereafter printed circuit boards (1) are illuminated by a suitable device and scanned with an optical sensor (4). The output signal of this sensor (4) is used by the image processing system to calculate the position and types of components (12, 14) on board (1) by comparing contours, colour, shape and marking with a database. The image processing system controls the next process step in which components are removed from printed circuit board (1) by a removal device (11) for surface mounted components with a gripper (20) which functions with negative pressure. These components (12) can be reused. In the next process step components (14) provided with leads are removed by a suitable removal device (13) with a gripper (21) that mechanically grasps component (14). Removed wired components (14) can, like the surface mounted components (12), be reused or disposed of as special waste. On printed circuit board (1) remain only utilisable components (16). These are removed in a mass disassembly device (15) from printed circuit board (1) which is then completely free of components (12, 14, 16) and can also be utilised. The fully disassembled board (17) is stacked and utilised.

FIG. 7 represents two possibilities for liquefying the soldered connections on boards with mounted electronic components that is characterised by a rapid recognition, with few operational errors, of the contours of the components as well as economic efficiency.

What is claimed is:

1. Apparatus for the automated disassembly of a printed circuit board having mounted electronic components, comprising:

means for illuminating a printed circuit board having mounted electronic components intended for removal;

an optical sensor for sensing and recording images of the mounted electronic components illuminated by the means for illuminating, said optical sensor including means for transforming the images recorded into output signals;

an image processing system for receiving the output signals from said optical sensor, said image processing systems being capable of recognizing and recording coordinates of contours and location of the mounted electronic components intended for removal and including means for controlling the removal of the mounted electronic components; and, means for removing the mounted electronic components from the printed circuit board, said means for removing being controlled by said controlling means of said image processing system.

2. The apparatus for the automated disassembly of a printed circuit board according to claim 1, further comprising a lens disposed relative to said optical sensor and the printed circuit board so that a light beam reflected from the printed circuit board is projected onto said optical sensor, said means for illuminating creating a light beam which is approximately orthogonal to the printed circuit board with a punctually impinging light beam being on the printed circuit board, said optical sensor being a line sensor affixed a short distance adjacent said means for illuminating, so that an axis of said optical sensor is approximately orthogonal to the light beam reflected and is in a plane formed by the specular angle, with the printed circuit board being shifted surface-parallel relative to said optical sensor and said means for illuminating so that the light beam is deflected in such a way that the printed circuit board is scanned two-dimensionally.

3. The apparatus for the automated disassembly of a printed circuit board according to claim 1, further comprising a lens disposed relative to said optical sensor and the printed circuit board so that a light beam reflected from the printed circuit board is projected onto said optical sensor, said means for illuminating creating a light beam which is approximately orthogonal to the printed circuit board with a linearly impinging light beam being on the printed circuit board, said optical sensor being a surface-area sensor which is disposed adjacent said means for illuminating, the printed circuit board being shifted and scanned surface-parallel, orthogonally to a line of the light beam relative to said optical sensor.

4. The apparatus for the automated disassembly of a printed circuit board according to claim 1, further comprising a lens disposed relative to said optical sensor and the printed circuit board so that a light beam reflected from the printed circuit board is projected onto said optical sensor, said optical sensor being a surface-area sensor and arranged a short distance adjacent said means for illuminating, wherein said means for illuminating creates a plurality of stripe-like beams on the printed circuit board which are approximately orthogonal to a plane of the printed circuit board and are parallel to one another.

5. The apparatus for the automated disassembly of a printed circuit board according to claim 4, wherein said means for illuminating creates successive lines in differing numbers or widths.

6. The apparatus for the automated disassembly of a printed circuit board according to claim 1, wherein said means for illuminating is a laser or laser diode.

7. The apparatus for the automated disassembly of a printed circuit board according to claim 1, wherein said means for illuminating emits X-rays extending orthogonal to a plane of the printed circuit board, with said optical sensor being disposed on the surface of the printed circuit board opposite said means for illuminating.

8. The apparatus for the automated disassembly of a printed circuit board according to claim 1, wherein said optical sensor includes means for distinguishing between various intensities of reflected light.

9. The apparatus for the automated disassembly of a printed circuit board according to claim 1, wherein said means for illuminating includes means for automatically controlling the intensity of the illumination.

10. Apparatus for the automated disassembly of a printed circuit board having mounted electronic components, comprising:

means for heating a printed circuit board having mounted electronic components intended for removal;

an optical sensor for sensing and recording images of the mounted electronic components heated by the means for heating, said optical sensor being a thermal sensor and including means for transforming the images recorded into output signals;

an image processing system for receiving the output signals from said optical sensor, said image processing systems being capable of recognizing and recording coordinates of contours and location of the mounted electronic components intended for removal and including means for controlling the removal of the mounted electronic components; and, means for removing the mounted electronic components from the printed circuit board, said means for removing being controlled by said controlling means of said image processing system.

11. The apparatus for the automated disassembly of a printed circuit board according to claim 10, wherein said thermal sensor is a thermal camera.

12. The apparatus for the automated disassembly of a printed circuit board according to claim 10, wherein said means for heating is a solder bath.

13. The apparatus for the automated disassembly of a printed circuit board according to claim 10, wherein said optical sensor is a line or surface-area sensor.

14. The apparatus for the automated disassembly of a printed circuit board according to claim 10, wherein said optical sensor includes means for scanning the surface of the printed circuit board.

15. The apparatus for the automated disassembly of a printed circuit board according to claim 10, wherein said means for removing includes two grippers, with said image processing system utilizing an intersecting point of two locating edges, at which the printed circuit board is affixed by said two grippers, as a reference point.

16. The apparatus for the automated disassembly of a printed circuit board according to claim 10, wherein said image processing system controls an additional means for heating for briefly raising the temperature of soldered connections of the electronic components from a side of the printed circuit board on which the electronic components have been soldered so that the solder melts.

17. The apparatus for the automated disassembly of a printed circuit board according to claim 16, wherein said additional means for heating includes a jet of a hot liquid for melting the solder, said hot liquid being selected from the group consisting of an oil, paraffin and glycerine.

18. The apparatus for the automated disassembly of a printed circuit board according to claim 10, wherein said means for removing includes a gripper for gripping the electronic components by means of negative pressure suction.

19. The apparatus for the automated disassembly of a printed circuit board according to claim 18, wherein said gripper is disposed on a side of the printed circuit board on which the electronic components have been soldered thereto.

20. The apparatus for the automated disassembly of a printed circuit board according to claim 10, wherein said means for removing includes a gripper for gripping leads of the electronic components or the electronic components themselves.

21. The apparatus for the automated disassembly of a printed circuit board according to claim 20, wherein said gripper is float or spring mounted and includes gripping cants.

22. The apparatus for the automated disassembly of a printed circuit board according to claim 20, wherein said gripper is disposed on a side of the printed circuit board upon which the electronic components are mounted.

23. The apparatus for the automated disassembly of a printed circuit board according to claim 10, wherein said image processing system includes means for controlling said means for removing the mounted electronic components so that said means for removing deposits the electronic components so removed into assigned receptacles.

24. The apparatus for the automated disassembly of a printed circuit board according to claim 10, further comprising means for sorting the electronic components following their removal by said means for removing from the printed circuit board.

25. A method for the automated disassembly of a printed circuit board having mounted electronic components, comprising the steps of:

cleaning a printed circuit board having electronic components intended for removal;

illuminating the printed circuit board in a reflex-free manner;

optically scanning the printed circuit board following said illuminating step for obtaining an output signal;

recognizing and recording coordinates of contours and locations of the mounted electronic components intended for removal from the printed circuit board by forming an image via said output signal; and, removing the electronic components from the printed circuit board recognized and recorded during said recognizing and recording step.

26. The method for the automated disassembly of a printed circuit board according to claim 25, wherein said cleaning step is carried out via ultrasound.

27. The method for the automated disassembly of a printed circuit board according to claim 25, wherein said cleaning step is carried out by placing the printed circuit board in an immersion bath.

28. The method for the automated disassembly of a printed circuit board according to claim 25, wherein said cleaning step is carried out by a spraying process.

29. The method for the automated disassembly of a printed circuit board according to claim 25, wherein said cleaning step is carried out by rotating brushes.

30. A method for the automated disassembly of a printed circuit board having mounted electronic components, comprising the steps of:

cleaning a printed circuit board having electronic components intended for removal;

heating the printed circuit board;

optically scanning the printed circuit board for sensing and recording images of the mounted electronic components heated during said heating step for obtaining an output signal, said optical scanning step being carried out via a thermal sensor;

recognizing and recording coordinates of contours and locations of the mounted electronic components intended for removal from the printed circuit board by forming an image via said output signal; and, removing the electronic components from the printed circuit board recognized and recorded during said recognizing and recording step.

31. The method for the automated disassembly of a printed circuit board according to claim 30, wherein said cleaning step is carried out via ultrasound.

32. The method for the automated disassembly of a printed circuit board according to claim 30, wherein said cleaning step is carried out by placing the printed circuit board in an immersion bath.

33. The method for the automated disassembly of a printed circuit board according to claim 30, wherein said cleaning step is carried out by a spraying process.

34. The method for the automated disassembly of a printed circuit board according to claim 30, wherein said cleaning step is carried out by rotating brushes.

* * * * *